(12) United States Patent  (10) Patent No.: US 7,705,605 B2
Hayakawa et al.  (45) Date of Patent: Apr. 27, 2010

(54) VOLTAGE DETECTING APPARATUS

(75) Inventors: Kenji Hayakawa, Tokyo (JP); Yoshihiro Kawamura, Tokyo (JP)

(73) Assignee: Yazaki Corporation, Tokyo (JP)

( * ) Notice: Subject to any disclaimer, the term of this patent is extended or adjusted under 35 U.S.C. 154(b) by 127 days.

(21) Appl. No.: 11/902,605

(22) Filed: Sep. 24, 2007

(65) Prior Publication Data

US 2008/0079404 A1    Apr. 3, 2008

(30) Foreign Application Priority Data

Sep. 29, 2006    (JP) .............................. 2006-267398

(51) Int. Cl.
 *G01R 31/08* (2006.01)
(52) U.S. Cl. .................................... 324/522
(58) Field of Classification Search ................. 323/265, 323/268, 271; 324/509, 522, 544, 557, 76.11, 324/111

See application file for complete search history.

(56) References Cited

U.S. PATENT DOCUMENTS 5,818,236 A * 10/1998 Sone et al. .................. 324/509

7,075,311 B1 * 7/2006 Oshiro et al. ............... 324/557

FOREIGN PATENT DOCUMENTS

JP    2004-170103    6/2004
JP    2004-245632    9/2004

* cited by examiner

*Primary Examiner*—Matthew V Nguyen
(74) *Attorney, Agent, or Firm*—Edwards Angell Palmer & Dodge LLP

(57) ABSTRACT

A voltage detecting apparatus for detecting a voltage of a direct current power source by using a capacitor, which can process an abnormal voltage without elongation of measuring time. When a voltage between both terminals of the capacitor is greater than a maximum voltage in normal condition, a micro-computer discharges the capacitor through a third switch and a fourth switch to earth until the voltage between both terminals of the capacitor reduces to be not larger than a voltage corresponding to a maximum rated current of a reset switch. When the voltage between both terminals reaches to be not larger than the voltage corresponding to the maximum rated current, the capacitor is rapidly discharged through the reset switch by controlling the reset switch to be closed.

6 Claims, 5 Drawing Sheets

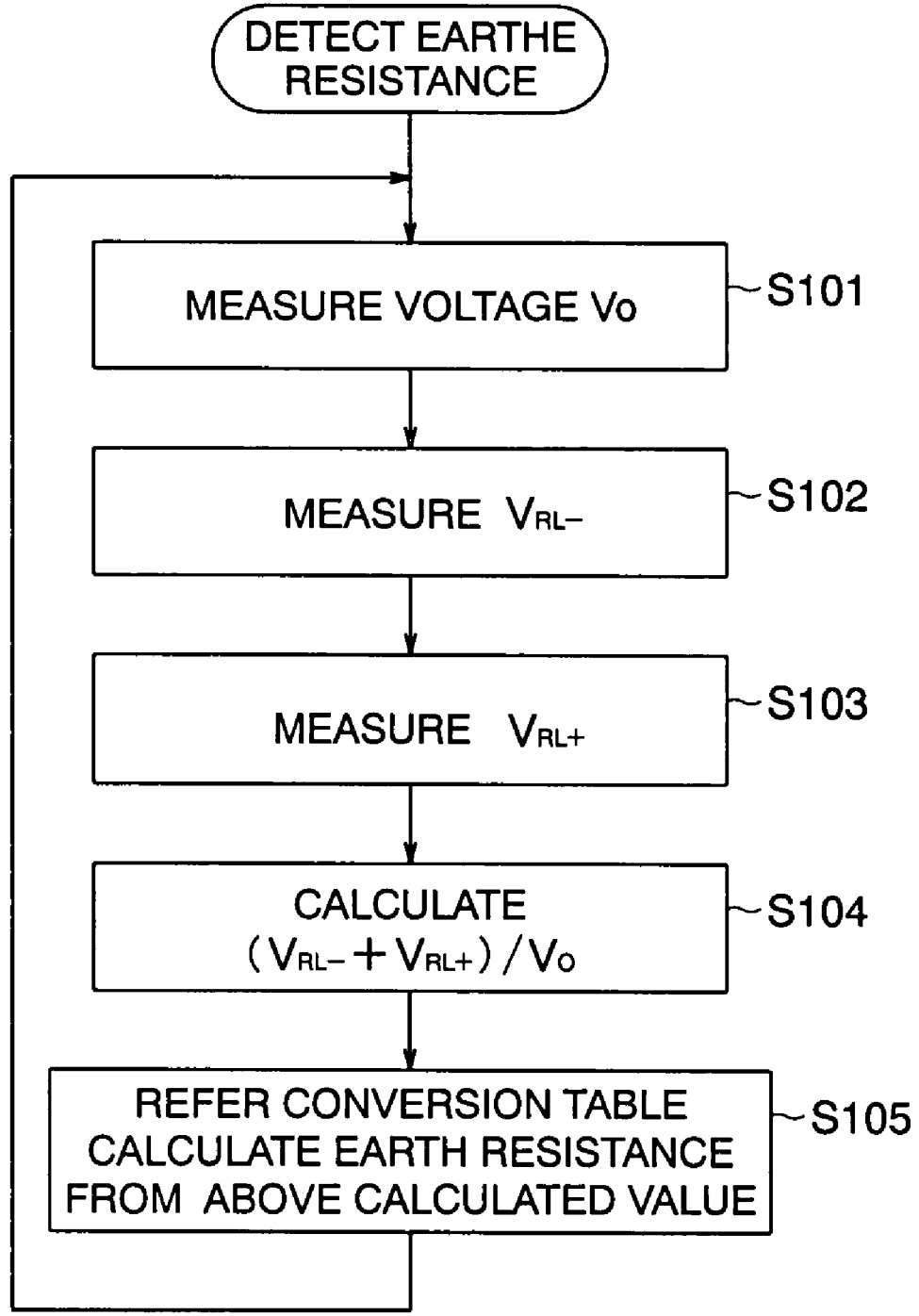

VOLTAGE DETECTING APPARATUS

The priority application Number Japan Patent Application 2006-267398 upon which this patent application is based is hereby incorporated by reference.

BACKGROUND OF THE INVENTION

1. Field of the Invention

This invention relates to a voltage detecting apparatus, especially a voltage detecting apparatus for detecting a voltage of a direct current power source.

2. Description of the Related Art

As a voltage detecting apparatus for detecting a voltage of a direct current power source, there is generally, for example, a flying-capacitor-type insulation detecting apparatus. For detecting an insulating condition of an insulation condition of the high-voltage direct-current power source, a value of earth-fault resistance is calculated based on a measured value of a voltage between both terminals of an ungrounded capacitor (i.e. flying capacitor) charged with a voltage of the high-voltage power source and a measured value of a voltage between both terminals of the capacity, one terminal of which is grounded through a resistor, similarly charged with the voltage of the high-voltage power source. Thereby, the insulation condition of the high-voltage power source can be detected. There are Patent documents 1, 2 as references.

FIG. 4 is a circuit diagram showing one example of structures of general insulation detecting apparatuses by prior art. In FIG. 4, a mark V is a high-voltage power source (a direct-current power source), which is formed by connecting N numbers of batteries in series, and insulated from an earth G in a low-voltage system, such as a micro-computer 10.

The insulation detecting apparatus, as shown in FIG. 4, includes a bipolar capacitor C, a first switch SW1 for connecting a positive electrode of the high-voltage power source insulated from the earth G to one terminal of the capacitor C, and a second switch SW2 for connecting a negative electrode of the high-voltage power source insulated from the earth G to the other terminal of the capacitor C.

The micro-computer 10 has a function of measuring a voltage supplied to an input port A/D by converting the voltage from analog data to digital data. The insulation detecting apparatus includes a third switch SW3 for connecting the one terminal of the capacitor C to the input port A/D, and a fourth switch SW4 for connecting the other terminal of the capacitor C to the earth G.

The insulation detecting apparatus also includes a first resistor R1 provided between a terminal near to the input port A/D of the third switch SW3 and the earth G, and a second resistor R2 provided between a terminal near to the earth G of the fourth switch SW4 and the earth G.

To the input port A/D, the voltage is supplied through a protection circuit 11. The protection circuit 11 includes a protection resistor Rp1 provided between a terminal near to the third switch SW3 of the first resistor R1 and the input port A/D, and a clamp diode Dc provided between a terminal near to the input port A/D of the protection resistor Rp1 and the earth G.

The protection resistor Rp1 performs as a current limiting resistor to prevent over-current flowing into the input port A/D of the micro-computer 10. It can be prevented by the clamp diode Dc that too large positive or negative voltage to damage the micro-computer 10 is supplied to the input port A/D.

The insulation detecting apparatus also includes a resistor select circuit 12 provided between a connecting line of the first switch SW1 and the third switch SW3 and the capacitor C. The resistor select circuit 12 is structured by connecting in parallel a series circuit, which has a first diode D1 connected in a forward direction from the connecting line of the first switch SW1 and the third switch SW3 toward the capacitor C and a first select resistor Rc1, and a series circuit, which has a second diode D2 connected in a reverse direction opposite to the direction of the first diode D1 and a second select resistor Rc2.

An optical MOSFET is used for the first, second, third or fourth switches SW1-SW4 so as to be controllable by the micro-computer and insulate the high-voltage power source V. In a reset circuit 13, by controlling a reset switch SWr to be close, electric charge stored in the capacitor C is rapidly discharged through a discharge resistor Rdc.

Actions of the insulation detecting apparatus structured above will be described with reference to a flowchart in FIG. 5. In step S101, the micro-computer 10 measures a voltage between both-terminals $V_0$ of the high-voltage power source. Process of measuring this is proceeded as followings. When all switches are open in an initial condition, the micro-computer 10 controls the first switch SW1 and the second switch SW2 to both be closed for charging the capacitor C with the voltage of the high-voltage power source V.

After controlling the first and second switches SW1, SW2 to be open, by controlling the third and fourth switches SW3, SW4 to both be closed, a voltage between both terminals of the capacitor C, that is the voltage between both-terminals $V_0$ of the high-voltage power source, is supplied into an input port A/D of the micro-computer 10. Thereby, the voltage between both-terminals $V_0$ is inputted as a voltage of the high-voltage power source V into the micro-computer 10.

In step S102, the micro-computer 10 measures a voltage $V_{RL-}$ corresponding to a value of a negative-electrode-side earth resistor RL−. This measuring is proceeded as following. After the reset circuit 13 resets, the micro-computer 10 controls the first and fourth switches SW1, SW4 to both be closed. Then, the capacitor C is charged with a charged voltage corresponding to a resistance value of the negative-electrode-side earth resistor RL−.

After controlling the first switch SW1 to be open, the micro-computer 10 closes the third and fourth switches SW3, SW4. Thereby, the voltage between both-terminals of the capacitor C, that is the voltage $V_{RL-}$ corresponding to the resistance value of the negative-electrode-side earth resistor RL− is inputted into the micro-computer 10.

In step S103, the micro-computer 10 measures a voltage $V_{RL+}$ corresponding to a resistance value of the positive-electrode-side earth resistor RL+. This measurement proceeds as follows. After the reset circuit 13 resets, the micro-computer 10 controls the second and third switches SW2, SW3 to both be closed. Thereby, the capacitor C is charged with a charged voltage corresponding to a resistance value of the positive-electrode-side earth resistor RL+.

After controlling the second switch SW2 to be open, the micro-computer 10 closes the third and fourth switches SW3, SW4. Thereby, the voltage between both-terminals of the capacitor C, that is the voltage $V_{RL+}$ corresponding to the resistance value of the positive-electrode-side earth resistor RL+ is inputted into the micro-computer 10.

In step S104, the micro-computer 10 performs a calculation $(V_{RL-}+V_{RL+})/V_0$ of dividing a sum of the measured voltage $V_{RL-}$ corresponding to the resistance value of the negative-electrode-side earth resistor RL− and the measured voltage $V_{RL+}$ corresponding to the resistance value of the positive-electrode-side earth resistor RL+ by the measured voltage $V_0$ corresponding to the voltage of both terminals of the high-voltage power source V. In step S105, the microcomputer 10 calculates a value of the earth resistance of the high-voltage power source V by the above calculated value with reference to a conversion table of calculated values to values of the earth resistances pre-stored in an inner memory.

Thus, whenever the capacitor C is charged with the voltage of both terminals $V_0$ of the high-voltage power source V, the voltage $V_{RL+}$ corresponding to the resistance value of the positive-electrode-side earth resistor RL+ and the voltage $V_{RL-}$ corresponding to the resistance value of the negative-electrode-side earth resistor RL−, by controlling the first-fourth switches SW1-SW4 respectively, and reading the voltage between both terminals of the capacitor C, the microcomputer 10 can detect an insulation condition of the high-voltage power source V. Refer Patent documents of Japan Published Patent Applications No. 2004-170103 and No. 2004-245632.

SUMMARY OF THE INVENTION

According to usual voltage detecting apparatus of the prior art, voltage values measured in step S101, step S102 and step S103 may be abnormal values over a value of a maximum voltage measured in a normal condition. In this situation, because electric current larger than that in the normal condition flows through the reset circuit 13 during discharging the capacitor C by the reset circuit 13 after measuring, it is required to design so that the circuit has a flowing current margin against flowing current in a normal condition by providing a plurality of reset switches SWr arranged in parallel or increasing a rated current of the discharge resistor Rdc.

For designing the circuit having the flowing current margin against the flowing current in the normal condition, components used in the circuit become more expensive and then a cost and a size of the circuit will increase, with the result that miniaturization of the apparatus is limited.

When the flowing current in the normal condition is limited by designing the flowing current through the reset switch SWr in the abnormal condition to be less than the maximum rated current of the reset switch SWr, discharging in the normal condition takes much time, so that time for measuring is increased.

In order to solve the above problem, the present invention provides a voltage detecting apparatus by detecting a voltage by using a capacitor connected in series with an earth resistance of a direct-current power source, so that the voltage detecting apparatus can process an action in an abnormal voltage without shortening a measuring time in a normal condition.

In order to overcome the above problems, a voltage detecting apparatus of the present invention includes a direct-current power source insulated from earth; a capacitor; a voltage measuring unit for measuring a voltage between terminals of the capacitor; a first switch connected between a positive electrode of the direct-current power source and one terminal of the capacitor; a second switch connected between a negative electrode of the direct-current power source and the other terminal of the capacitor; a third switch connected between the one terminal of the capacitor and the voltage measuring unit; a fourth switch connected between the other terminal of the capacitor and the earth; a fifth switch connected between the one terminal of the capacitor and the earth; and a switch controller for controlling the first, second, third, fourth and fifth switches selectively to be closed, and when a voltage between both terminals of the capacitor measured by the voltage measuring unit is greater than a predetermined value in a condition of controlling the third and fourth switches to be closed, the capacitor is discharged gradually and, when the voltage between both terminals of the capacitor is reduced to the predetermined value or less, the switch controller controls the fifth switch to be closed.

In the voltage detecting apparatus, as mentioned above, the predetermined value is set at a voltage corresponding to flowing a maximum rated current of the fifth switch.

The voltage detecting apparatus, as mentioned above, further includes a resistor between the fifth switch and the earth, such that, when the voltage between both terminals of the capacitor measured by the voltage measuring unit becomes a value defined with the maximum rated current and a resistance value of the resistor or less, the switch controller controls the fifth switch to be closed.

In the voltage detecting apparatus mentioned above, the resistance value of the resistor is set so that, when the voltage between both terminals of the capacitor has a value equal to the predetermined voltage, a current flowing through the fifth switch is not greater than the maximum rated current.

According to the present invention, the resistance value of the resistor is set so that, when the voltage between both terminals of the capacitor measured by the voltage measuring unit is equal to the predetermined voltage, the capacitor is discharged gradually and, when the voltage between both terminals of the capacitor is reduced to the predetermined value or less, the switch controller controls the fifth switch to be closed so as to rapidly discharge the electric charge of the capacitor. Thereby, the maximum rated current of the fifth switch is greater than a flowing current in a normal condition. Therefore, it is not required to design marginally for an abnormal voltage condition, so that cost-up, enlarged component sizes and an elongated measuring time in the normal condition can be eliminated.

According to the present invention, the resistance value of the resistor is set so that, the predetermined value is set at the voltage corresponding to flowing the maximum rated current of the fifth switch, so that the current flowing through the fifth switch is always equal to the flowing current in the normal condition and always less than the maximum rated current of the fifth switch. Therefore, cost-up, enlarged component sizes and an elongated measuring time in the normal condition can be eliminated.

According to the present invention, the resistor is arranged between the fifth switch and the earth, and the switch controller can calculate the voltage corresponding to the maximum rated current by Ohm's law with the maximum rated current and the resistance value of the resistor so that it can be judged with the voltage between both terminals of the capacitor measured by the voltage measuring unit whether or not the current is less than the maximum rated current.

According to the present invention, when the voltage between both terminals of the capacitor is equal to the predetermined voltage, the current flowing through the fifth switch is limited to be less than the maximum rated current of the fifth switch by using a resistor. Thereby, the flowing current through the fifth switch in the normal condition is always less than the maximum rated current. Therefore, cost-up, enlarged component sizes and an elongated measuring time in the normal condition can be eliminated.

The above and other objects and features of this invention will become more apparent from the following description taken in conjunction with the accompanying drawings.

BRIEF DESCRIPTION OF THE DRAWINGS

FIG. 5 is a FIG. 2 is a flowchart showing processes for calculating an earth resistance in the voltage detecting apparatus shown in FIG. 4.

DESCRIPTION OF THE PREFERRED EMBODIMENT

Figure 1:
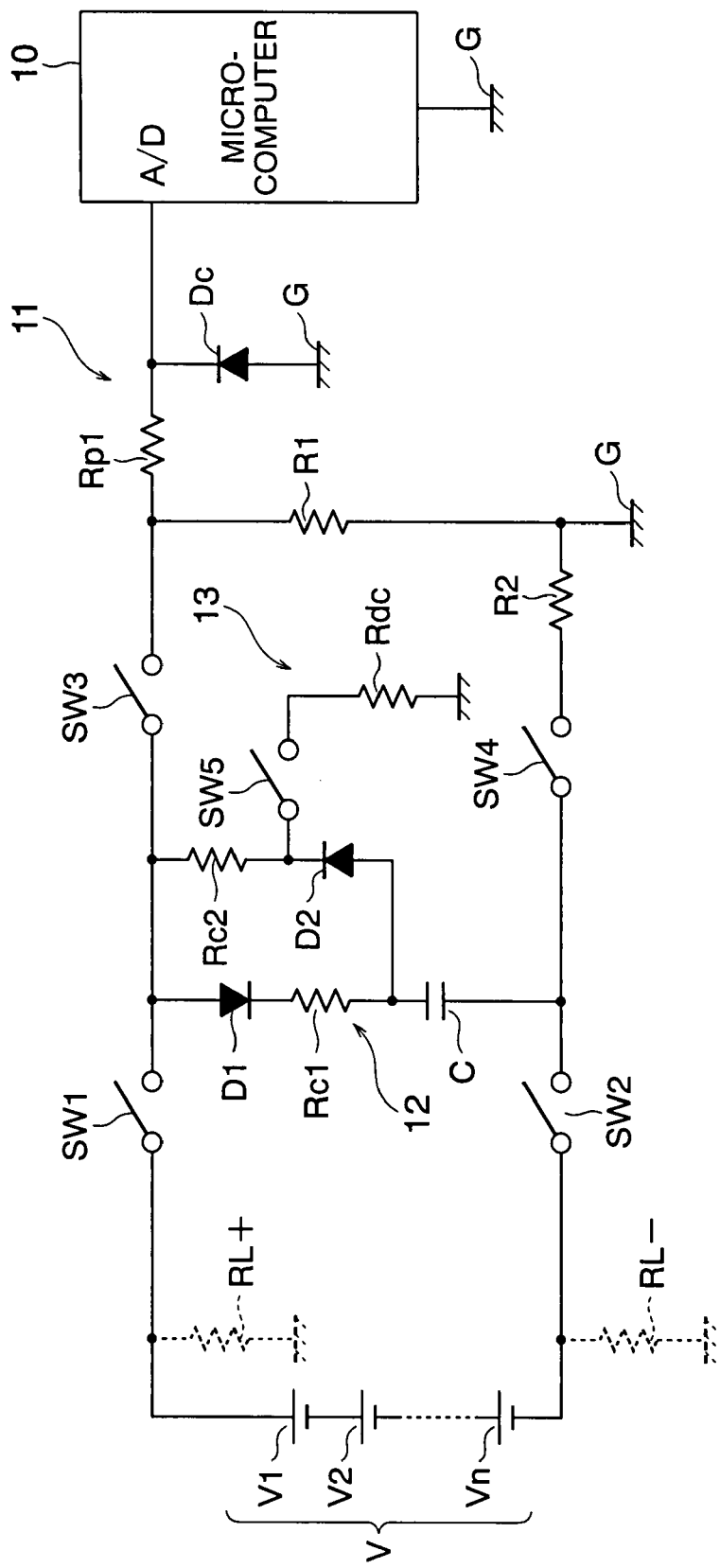
FIG. 1 is a circuit diagram of an embodiment of a voltage detecting apparatus according to the present invention.

An insulation detecting apparatus as the voltage detecting apparatus according to the present invention will be described with reference to the drawings. FIG. 1 is a circuit diagram of one embodiment of the insulation detecting apparatus as the voltage detecting apparatus according to the present invention. A high-voltage power source V as a direct-current power source is formed by connecting batteries of N numbers in series and insulated from earth by a low-voltage system, such as a micro-computer 10.

As shown in FIG. 1, the insulation detecting apparatus includes a capacitor C, a micro-computer 10, a first switch SW1, a second switch SW2, a third switch SW3, a fourth switch SW4, a first resistor R1, a second resistor R2, a protection circuit 11, a resistor select circuit 12, and a reset circuit 13.

The capacitor C is a bipolar capacitor for measuring a voltage of a high-voltage power source by a flying-capacitor method.

The micro-computer 10 as a switch controller and a voltage detecting unit includes an internal memory, an input port A/D, a voltage measuring function for measuring a voltage supplied into the input port A/D by converting from analog to digital, an earth-resistance calculating function for calculating an earth resistance from the voltage measured by the voltage measuring function by using a predetermined calculating formula and a conversion table, and a switch control function for controlling respective switches to be open or close.

The first switch SW1 is for connecting a positive electrode of the high-voltage power source, which is insulated from an earth G, to one terminal of the capacitor C. The second switch SW2 is for connecting a negative electrode of the high-voltage power source to the other terminal of the capacitor C.

The third switch SW3 is for connecting the one terminal of the capacitor C to the input port A/D. The fourth switch SW4 is for connecting the other terminal of the capacitor C to the earth G.

For the first-fourth switches SW1-SW4, optical FETs are applied so as to be insulated from the high-voltage power source V and controlled by the micro-computer 10.

The first resistor R1 is arranged between a terminal near the input port A/D of the third switch SW3 and the earth G. The second resistor R2 is arranged between a terminal near the earth G of the fourth switch SW4 and the earth G.

The protection circuit 11 has a protection resistor Rp1 and a clamp diode Dc. A voltage is supplied through the protection circuit 11 into the input port A/D of the micro-computer 10.

The protection resistor Rp1 is arranged between a terminal near the third switch SW3 of the first resistor R1 and the input port A/D so as to function as a current limit resistor to prevent over-current from flowing into the input port A/D of the micro-computer 10. The clamp diode Dc is arranged between a terminal near the input port A/D of the protection resistor Rp1 and the earth G so as to prevent over positive voltage or over negative voltage, which damages the micro-computer 10, from supply to the input port A/D of the micro-computer 10.

The resistor select circuit 12 includes a first diode D1, a first select resistor Rc1, a second diode D2, and a second select resistor Rc2. The resistor select circuit 12 is arranged between a connecting line of the first switch SW1 and the third switch SW3, and the capacitor C.

The first diode D1 is connected in a forward direction from the connecting line of the first switch SW1 and the third switch SW3 toward the capacitor C. The first select resistor Rc1 is connected between the first diode D1 and the capacitor C so as to be in series to the first diode D1.

The second diode D2 is connected in a forward direction from the capacitor C toward the connecting line of the first switch SW1 and the third switch SW3. In other words, the second diode D2 is connected in a reverse direction opposite the direction of the first diode D1. The second select resistor Rc2 is connected between the second diode D2 and the connecting line of the first switch SW1 and the third switch SW3, in series with the second diode D2.

The resistor select circuit 12 connects in parallel a series circuit of the first diode D1 and the first select resistor Rc1, and a series circuit of the second diode D2 and the second select resistor Rc2.

The first and second diodes D1, D2 select one of the first and second select resistors Rc1, Rc2 corresponding to a polar direction of the capacitor C, and electrically connect the selected one between the connecting line of the first switch SW1 and the third switch SW3, and the capacitor C.

The reset circuit 13 has a reset switch SW5 as a fifth switch and a discharge resistor Rdc as a resistor. The reset switch SW5 is controlled by the micro-computer 10, and by controlling the reset switch SW5 to be closed, electric charge in the capacitor C can be rapidly discharged.

A value of the discharge resistor Rdc is lower than that of the first resistor R1, the second resistor R2 and the first select resistor Rc1, and is designed so that the current, which flows through the reset switch SW5 to be closed when the capacitor C is charged with the electrical charge corresponding to the maximum voltage in a normal condition of the high-voltage power source, is not over the maximum rated current of the reset switch SW5. In other words, the value of resistance of the discharge resistor Rdc limits the current flowing through the reset switch SW5 at the maximum voltage in the normal condition as the predetermined voltage not to be over the maximum rated current of the reset switch SW5. The predetermined voltage corresponding to the maximum rated current can be calculated by Ohm's law with the maximum rated current and the resistance value of the resistor. The maximum rated current means a maximum current allowable to flow through components used in the reset switch SW5.

Processes of measuring a voltage of the insulation detecting apparatus, structured above, according to the present invention will be described with reference to flowcharts in FIGS. 2 and 3.

In step S1, a measurement mode from among $V_0$ measurement, $V_{c-}$ measurement, and $V_{c+}$ measurement is selected, and on the $V_0$ measurement, the process goes to step S2, on the $V_{c-}$ measurement, the process goes to step S3, and on the $V_{c+}$ measurement, the process goes to step S4. Selecting the measurement mode about the order in step S1 can be determined previously, or can be determined step-by-step.

In step S2, for measuring a high voltage, that is, the voltage between both terminals $V_0$ of the capacitor C, of the high-voltage power source V, the micro-computer 10 controls the first switch SW1 and the second switch SW2 to be closed during charging time T1 from a initial condition in which all switches are open, and the process goes to step S5. The charging time T1 is set to be less than a time required for full-charging the capacitor. The positive electrode of the high-voltage power source V, the first switch SW1, the first diode D1, the first select resistor Rc1, the capacitor C, the second switch SW2, and the negative electrode of the high-voltage power source V form a closed circuit, and the capacitor C insulated from the earth G is charged with the voltage between both terminals $V_0$.

In step S3, for measuring a voltage Vc− corresponding to a value of a negative-electrode-side earth resistor RL−, the micro-computer 10 controls the first switch SW1 and the fourth switch SW4 to be closed during the charging time T1, and the process goes to step S5. The positive electrode of the high-voltage power source V, the first switch SW1, the first diode D1, the first select resistor Rc1, the capacitor C, the fourth switch SW4, the second resistor R2, the earth G, the negative-electrode-side earth resistor RL−, and the negative electrode of the high-voltage power source V form a closed circuit, and the capacitor C is charged with the voltage corresponding to the value of the negative-electrode-side earth resistor RL−.

In step S4, for measuring a voltage Vc+ corresponding to a value of a positive-electrode-side earth resistor RL+, the micro-computer 10 controls the second switch SW2 and the third switch SW3 to be closed during the charging time T1, and the process goes to step S5. The positive electrode of the high-voltage power source V, the positive-electrode-side earth resistor RL+, the earth G, the first resistor R1, the third switch SW3, the first diode D1, the first select resistor Rc1, the capacitor C, the second switch SW2, and the negative electrode of the high-voltage power source V form a closed circuit, and the capacitor C is charged with the voltage corresponding to the value of the positive-electrode-side earth resistor RL+.

In step S5, the micro-computer 10 controls the switches, which are closed, to be open so as to complete charging the capacitor, and the process goes to step S6.

In step S6, the third and fourth switches SW3, SW4 are controlled to be closed, and the process goes to step S7. Thereby, the capacitor C, the second diode D2, the second select resistor Rc2, the third switch SW3, the first resistor R1, the second resistor R2, and the fourth switch SW4 form a closed circuit, and a value corresponding to the voltage between both terminals of the capacitor C is supplied into the input port A/D of the micro-computer 10, and read therein.

In step S7, the micro-computer 10 judges whether or not the voltage charged in the capacitor C read therein in step S6 is greater than the maximum voltage in the normal condition as the predetermined value. When the voltage is greater than the maximum voltage in the normal condition, the process goes to step S9. When the voltage is not greater than the maximum voltage, the process goes to step S8. The maximum voltage in the normal condition is set at a maximum voltage to exit in the normal condition respectively for the voltage between both terminals $V_0$, the voltage corresponding to the value of the negative-electrode-side earth resistor RL−, and the voltage corresponding to the value of the positive-electrode-side earth resistor RL+.

In the step S8, the micro-computer 10 controls the reset switch SW5 to be closed so as to rapidly discharge the capacitor C, and the process goes back to step S1. Because the resistance value of the discharge resistor Rdc is smaller than that of the first resistor R1, the second resistor R2 and the second select resistor Rc2, the electric charge, which is discharged through the first resistor R1 and the second resistor R2 to the earth G, is rapidly discharged through the reset switch SW5 and the discharge resistor Rdc to the earth G.

After measuring the voltage between both terminals $V_0$ of the high-voltage power source, the voltage corresponding to the value of the negative-electrode-side earth resistor RL−, and the voltage corresponding to the value of the positive-electrode-side earth resistor RL+ by repeating the flowchart, by referring to a value calculated by $((V_{c-})+(V_{c+}))/V_0$ in the conversion table stored in the memory of the micro-computer 10, an earth resistance can be calculated.

In step S9, because the voltage charged in the capacitor C, that is, the voltage between both terminals of the capacitor C, is greater than the maximum voltage in the normal condition, the process for the abnormal condition is initiated. Physically, a flowchart shown in FIG. 3 is processed.

In step S11, the micro-computer 10 reads the value corresponding to the voltage between both terminals from the input port A/D, and the process goes to step S12. In the closed circuit formed by the capacitor C, the second diode D2, the second select resistor Rc2, the third switch SW3, the first resistor R1, the second resistor R2, and the fourth switch SW4, the capacitor C is charged gradually at a speed corresponding to values of the first resistor R1, the second resistor R2 and the second select resistor Rc2 to the earth G. Thereby, in the closed circuit, the voltage between both terminals of the capacitor C reduces gradually.

In step S12, the micro-computer 10 judges whether or not the voltage between both terminals of the capacitor C measured in step S11 is not larger than the voltage corresponding to the maximum rated current of the reset switch SW5. When the voltage between both terminals is not larger than the voltage corresponding to the maximum rated current of the reset switch SW5, the process goes to step S13. When the voltage between both terminals is larger, the process goes back to step S11. Because a value of current flowing through the reset switch SW5 can be calculated with the resistance value of the discharge resistor Rdc and the voltage between both terminals of the capacitor C, by previously calculating the voltage between both terminals of the capacitor C corresponding to the maximum rated current, it can be judged whether or not the voltage between both terminals of the capacitor C is larger than the voltage corresponding to the maximum rated current of the reset switch SW5.

In step S13, the micro-computer 10 controls the reset switch SW5 to be closed for discharging rapidly the capacitor C, and the process goes to step S14. The resistance value of the discharge resistor Rdc is smaller than that of the first resistor R1, the second resistor R2 and the second select resistor Rc2, so that the electric charge in the capacitor C, discharged gradually through the first resistor R1 or the second resistor R2, is rapidly discharged through the reset switch SW5 and the discharge resistor Rdc. Because the current flowing through the reset switch SW5 reduces to be not larger than the maximum rated current, the capacitor C is rapidly discharged by using the rest circuit 13.

In step S14, the micro-computer 10 instructs an order of alarm to an alarming unit (not shown) outside of the insulation detecting apparatus, and the process goes to step S15.

In step S15, the micro-computer 10 judges whether or not an instruction of restarting measurements from outside of the insulation detecting apparatus is received. When the instruction is received, the process goes back to a normal process (step S1 in FIG. 2). When the instruction is not received, the process is maintained in this step. In other words, when the abnormal voltage exists, after discharging the capacitor C according to steps S11-S12, measurements of the voltage between both terminals $V_0$, the voltage corresponding to the value of the negative-electrode-side earth resistor RL−, and the voltage corresponding to the value of the positive-electrode-side earth resistor RL+ are intercepted until the instruction of restart is received.

According to the above insulation detecting apparatus, when the voltage between both terminals of the capacitor C is measured and the voltage is over the maximum voltage in the normal condition, the micro-computer 10 gradually discharges the capacitor until the voltage between both terminals of the capacitor C reduces to be not larger than the voltage corresponding to the maximum rated current of the reset switch SW5. When the voltage between both terminals of the capacitor C reaches to be not larger than the voltage corresponding to the maximum rated current of the reset switch SW5, by controlling the reset switch SW5 to be closed, the capacitor C can be rapidly discharged at the current not larger than the maximum rated current of the reset switch SW5. Therefore, the maximum rated current of the reset switch SW5 is enough over the current in the normal condition, so that it is not required to design marginally by taking the abnormal voltage into account, thereby cost-up, enlargement of components and elongation of measurement time can be eliminated.

According to the above insulation detecting apparatus, the current flowing through the reset switch SW5 is limited to be not over the maximum rated current of the reset switch SW5 by the discharge resistor Rdc when the voltage between both terminals of the capacitor C is the maximum voltage. Thereby, the current flowing through the reset switch SW5 in the normal condition is never larger than the maximum rated current.

Figure 2:
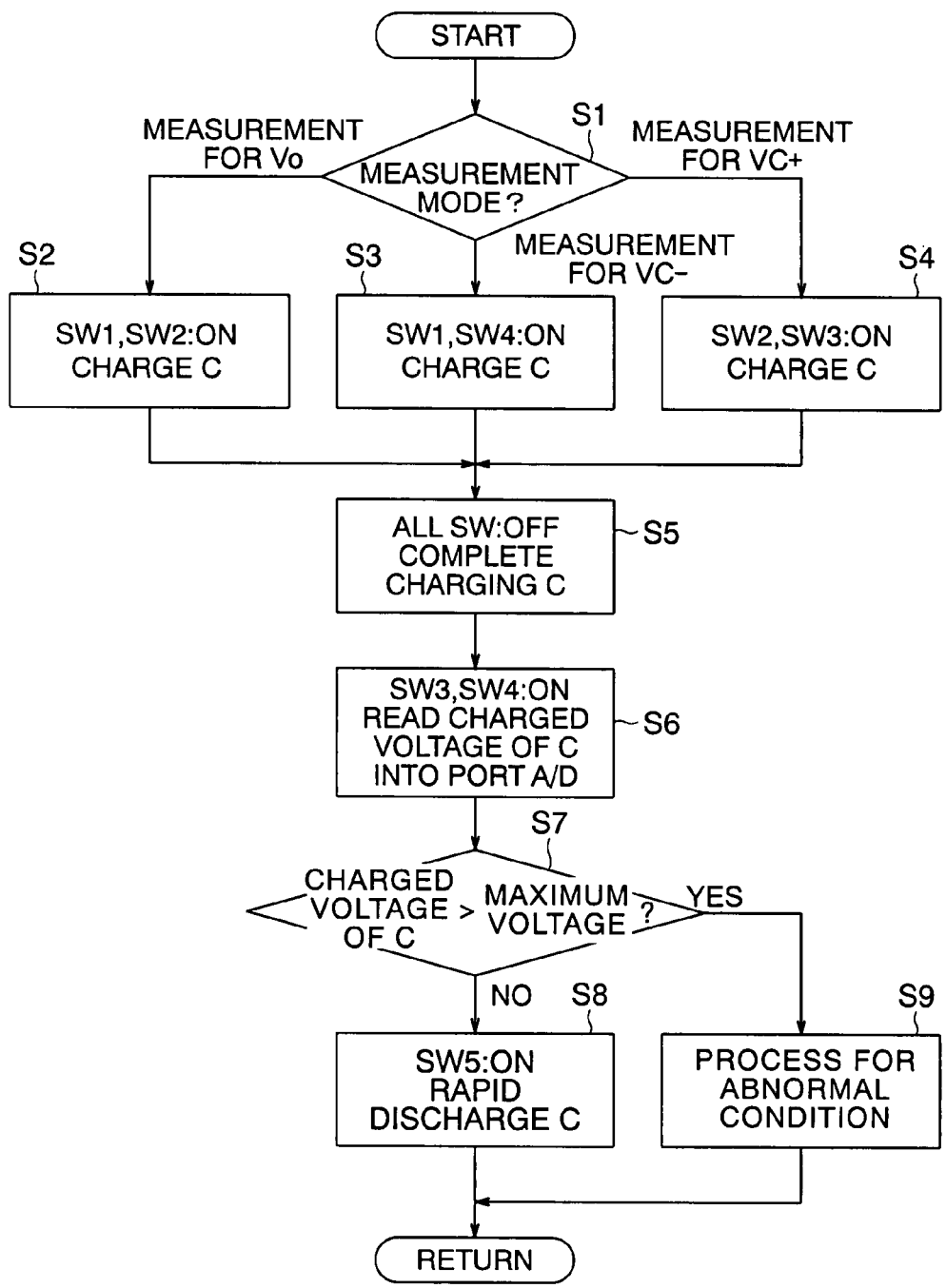
FIG. 2 is a flowchart showing processes for measuring voltage in the voltage detecting apparatus shown in FIG. 1.
Figure 3:
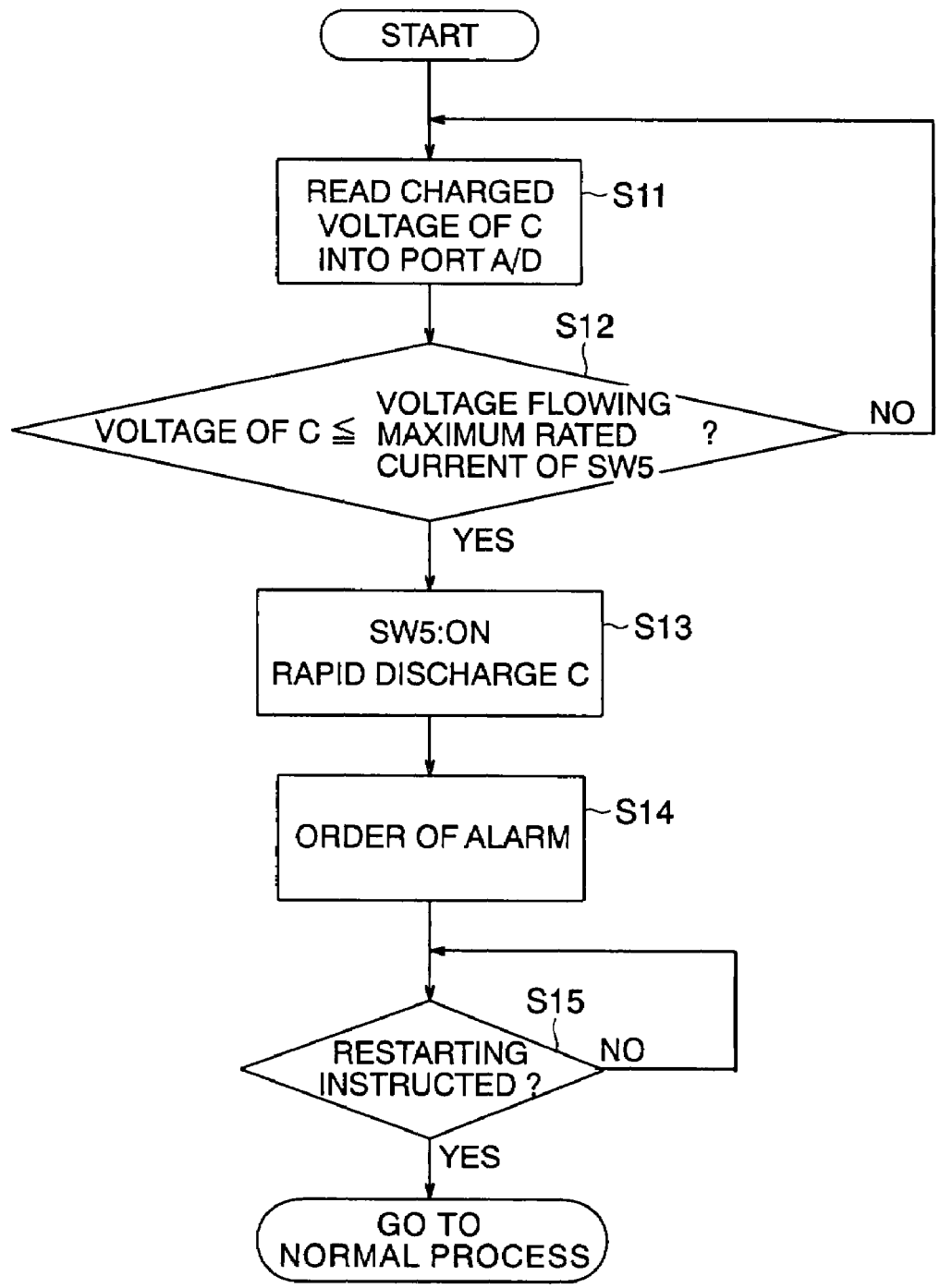
FIG. 3 is a flowchart showing processes for abnormal condition in the flowchart shown in FIG. 1.
Figure 4:
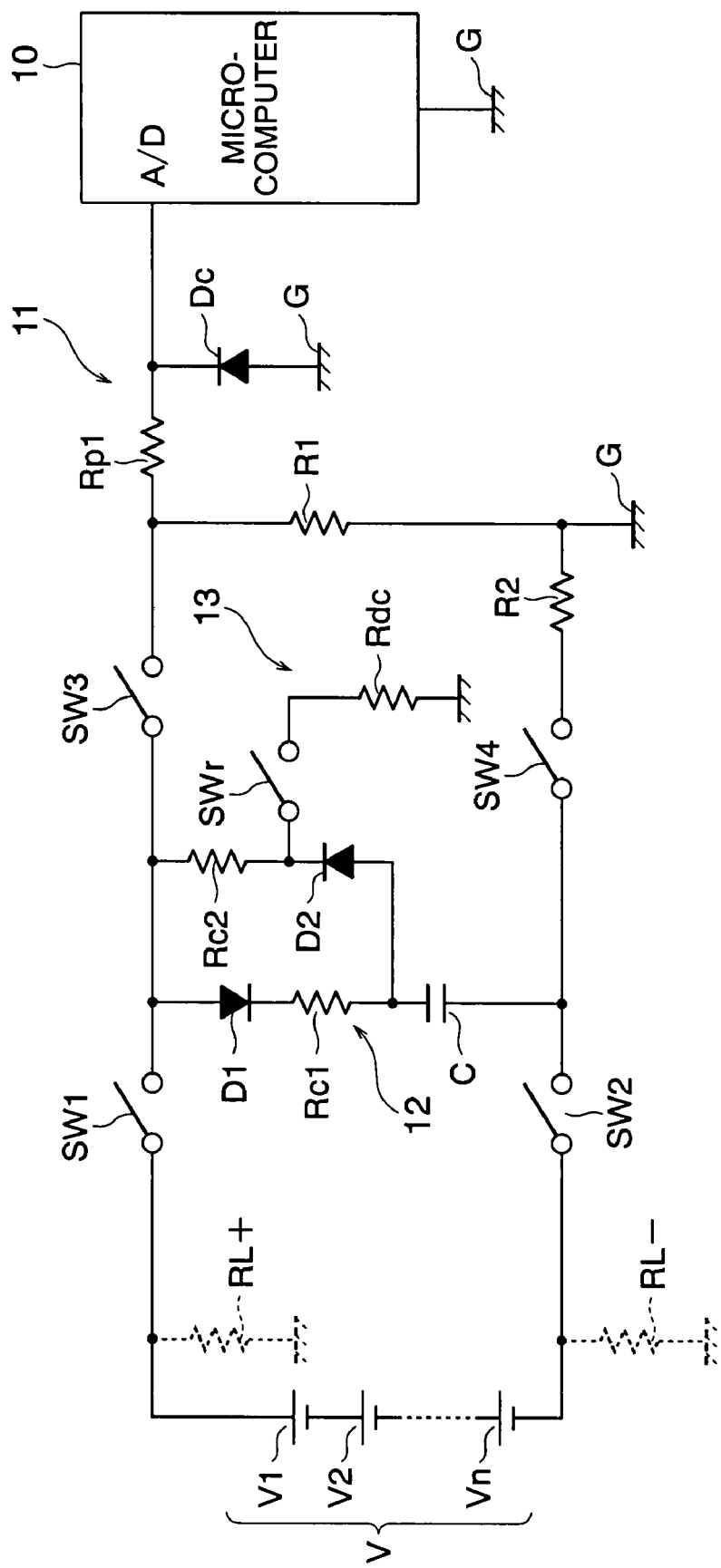
FIG. 4 is a circuit diagram of a voltage detecting apparatus by prior art.

According to the above embodiment, judgments are made as to whether or not the three voltage values in steps S2, S3, S4 in the flowchart of FIG. 2 are respectively over the maximum voltages in the normal condition. It is sufficient that at least only step S2 exists. Regardless of the voltages corresponding to the insulation resistance or the earth resistance, when the voltage of the direct-current power source is measured and the voltage is over the maximum voltage in the normal condition, the capacitor is discharged until the voltage between both terminals of the capacitor reduces to be not larger than the voltage corresponding to the maximum rated current of the reset switch SW5 by controlling the third switch SW3 and the fourth switch SW4 to be close. When the voltage between both terminals of the capacitor becomes to be not larger than the voltage corresponding to the maximum rated current of the reset switch SW5, the reset switch SW5 is controlled to be close.

According to the above embodiment, when the abnormal condition is detected and the voltage between both terminals of the capacitor C reaches the voltage corresponding to the maximum rated current of the reset switch SW5, the reset switch SW5 is controlled to be closed. When the voltage between both terminals of the capacitor C reaches to be the voltage corresponding to the maximum rated current of the reset switch SW5, the reset switch SW5 is controlled to be closed. Thereby, the current flowing through the reset switch SW5 becomes always current flowing therethrough in the normal condition, so that the current flowing therethrough is always smaller than the maximum rated current of the rest switch SW5.

According to the above embodiment, measurements after instructing a command of alarm and discharging the capacitor C is interrupted in the abnormal condition. The measurement can be continued without interruption.

While, in the embodiment, an only typical example of the present invention is described, it is not limited thereto. Various change and modifications can be made with the scope of the present invention.

The invention claimed is:

1. A voltage detecting apparatus comprising:
   a direct-current power source insulated from earth;
   a capacitor;
   a voltage measuring unit for measuring a voltage between both terminals of the capacitor;
   a first switch connected between a positive electrode of the direct-current power source and one terminal of the capacitor;
   a second switch connected between a negative electrode of the direct-current power source and the other terminal of the capacitor;
   a third switch connected between the one terminal of the capacitor and the voltage measuring unit;
   a fourth switch connected between the other terminal of the capacitor and the earth;
   a fifth switch connected between the one terminal of the capacitor and the earth; and
   a switch controller for controlling the first, second, third, fourth and fifth switches selectively to be closed,
   wherein the voltage measuring unit includes a microcomputer having one terminal connected directly to the earth, and
   wherein, when a voltage between both terminals of the capacitor measured by the voltage measuring unit is greater than a predetermined value in a condition of controlling the third and fourth switches to be closed, the capacitor is discharged gradually and, when the voltage between both terminals of the capacitor is reduced to the predetermined value or less, the switch controller controls the fifth switch to be closed.

2. The voltage detecting apparatus according to claim 1, wherein the predetermined value is set equal to a voltage corresponding to a maximum rated current of the fifth switch.

3. The voltage detecting apparatus according to claim 1 further comprising a resistor between the fifth switch and the earth, wherein, when the voltage between both terminals of the capacitor measured by the voltage measuring unit becomes a value defined with the maximum rated current and a resistance value of the resistor or less, the switch controller controls the fifth switch to be closed.

4. The voltage detecting apparatus according to claim 3, wherein the resistance value of the resistor is set so that, when the voltage between both terminals of the capacitor is valued at the predetermined voltage, a current flowing through the fifth switch is not greater than the maximum rated current.

5. The voltage detecting apparatus according to claim 2 further comprising a resistor between the fifth switch and the earth, wherein, when the voltage between both terminals of the capacitor measured by the voltage measuring unit becomes a value defined with the maximum rated current and a resistance value of the resistor or less, the switch controller controls the fifth switch to be closed.

6. The voltage detecting apparatus according to claim 5, wherein the resistance value of the resistor is set so that, when the voltage between both terminals of the capacitor is valued at the predetermined voltage, a current flowing through the fifth switch is not greater than the maximum rated current.

* * * * *